United States Patent
Ueda et al.

(10) Patent No.: US 8,665,003 B2
(45) Date of Patent: Mar. 4, 2014

(54) DEAD-TIME GENERATING CIRCUIT AND MOTOR CONTROL APPARATUS

(75) Inventors: Yasuo Ueda, Kanagawa (JP); Masashi Tokuda, Kanagawa (JP); Toshihiro Tsukagoshi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 25 days.

(21) Appl. No.: 13/384,706

(22) PCT Filed: Sep. 3, 2010

(86) PCT No.: PCT/JP2010/065570
§ 371 (c)(1),
(2), (4) Date: Jan. 18, 2012

(87) PCT Pub. No.: WO2011/030842
PCT Pub. Date: Mar. 17, 2011

(65) Prior Publication Data
US 2012/0126735 A1 May 24, 2012

(30) Foreign Application Priority Data
Sep. 11, 2009 (JP) .................................. 2009-210673

(51) Int. Cl.
*H03K 17/296* (2006.01)
(52) U.S. Cl.
USPC ............... 327/393; 327/57; 327/67; 327/76; 327/166; 363/41; 363/132; 323/283
(58) Field of Classification Search
USPC ......... 363/41, 132; 323/283; 327/393, 57, 67, 327/166, 182
See application file for complete search history.

(56) References Cited

U.S. PATENT DOCUMENTS

| | | |
|---|---|---|
| 2005/0024897 A1 | 2/2005 | Yang et al. |
| 2007/0069698 A1* | 3/2007 | Laur et al. .................. 323/222 |
| 2008/0094121 A1* | 4/2008 | Nakamori et al. ............ 327/393 |
| 2008/0232138 A1 | 9/2008 | Yang et al. |

FOREIGN PATENT DOCUMENTS

| | | |
|---|---|---|
| JP | 2003-051740 A | 2/2003 |
| JP | 2003-289687 A | 10/2003 |
| JP | 2005-261091 A | 9/2005 |
| JP | 2007-006254 A | 1/2007 |

* cited by examiner

*Primary Examiner* — Eduardo Colon Santana
*Assistant Examiner* — Bickey Dhakal
(74) *Attorney, Agent, or Firm* — Dickstein Shapiro LLP

(57) ABSTRACT

A dead-time generating circuit includes a constant current circuit; a current generating circuit generating a capacitor-charge current; and a control circuit receiving a dead time control signal and a comparator signal. The control circuit generates a dead time generating signal based on the dead time control signal and the comparator signal, and a charge/discharge signal based on the dead time generating signal. Charging or discharging of a capacitor is controlled by the capacitor-charge current in accordance with the charge/discharge signal. A voltage of the capacitor is compared with a threshold voltage in order to generate a comparator signal when the voltage of the capacitor exceeds the threshold voltage. The control circuit generates the charge/discharge signal for a duration starting from a time when the delay time has elapsed from the rise or fall timing of the dead time control signal until the control circuit receives the comparator signal.

4 Claims, 14 Drawing Sheets

DEAD-TIME GENERATING CIRCUIT AND MOTOR CONTROL APPARATUS

TECHNICAL FIELD

The present invention relates to a dead-time generating circuit for generating a dead time for switching control of an inverter, and to a motor control apparatus for controlling a motor.

BACKGROUND ART

In a three-phase brushless DC motor drive circuit, switching elements in a three-phase inverter circuit are turned on and off by PWM control in order to drive a motor. An example of such a three-phase brushless DC motor drive circuit is disclosed in Patent Document 1. In this example, a pair of MOSFETs is provided for controlling each of the three phases, wherein the MOSFETs are turned on and off in order to control the driving of a motor. Specifically, each pair of the MOSFETs for the respective phase is connected in series as switching elements between a motor-driving power supply and ground. In the following, the MOSFETs on the motor-driving power supply side are referred to as "upper-stage elements", while the MOSFETs on the ground end side are referred to as "lower-stage elements". If an upper-stage element and a lower-stage element for a phase are simultaneously turned on, a large current flows between the power supply and ground, thereby damaging the elements. Thus, when an on- or off-state of an upper-stage element and a lower-stage element is switched, a period referred to as a "dead time" is provided in which both the upper-stage element and the lower-stage element are turned off so as to prevent the damage to these elements. However, if the dead time is too long, disadvantages such as decreased efficiency and torque, and increased acceleration time may result. If the dead time is too short, the MOSFETs may be damaged. Thus, it is necessary to set an appropriate dead time for the particular system.

FIG. 1 is a graph indicating the relationship between an input duty ratio of a PWM signal inputted to a system and an output duty ratio of an output signal to a motor, where the positive and negative values on the vertical axis and the horizontal axis show the duty ratio during positive and negative rotations, respectively, of the motor. Referring to FIG. 1, when there is no dead time, the characteristics are linear, as indicated by the broken line. When there is a dead time, linear characteristics are not obtained in a region A1 (when the duty ratio is small) or regions A2 and A3 (when the duty ratio is high) due to the influence of the dead time. Thus, the longer the dead time, the longer a control-disabled region (dead-zone) becomes when the duty ratio is low, and the lower the maximum output duty ratio becomes when the duty ratio is high. Therefore, when the dead time is too long, stability is reduced when the motor is driven at low speed or upon reversal of rotation direction. As a result, the acceleration time at the starting of the motor increases, and controllability is reduced. Thus, the dead time should be minimized.

Controllability also suffers if the length of the dead time during the transition from a first state in which the upper-stage element is on and the lower-stage element is off to a second state in which the upper-stage element is off and the lower-stage element is on is different from the length of the dead time during the transition in the opposite direction (i.e., from the second to the first state). Thus, it is also desirable to set these dead times to have the same length from the viewpoint of controllability.

When an on- or off-status of the MOSFETs is fixed, there would be no problem if the on/off-controlled phases are changed in synchronization with the dead time.

However, if the rotation direction of the motor is changed, or a brake control is performed (by turning on all of the lower-stage elements of the three-phase inverter circuit, for example) in the absence of a dead time, the state of the upper-stage element and the state of the lower-stage element are simultaneously changed, thereby possibly damaging the elements. Therefore, a dead time needs to be ensured.

FIG. 2 is a circuit diagram of a dead-time generating circuit 200 according to Patent Document 2. The dead-time generating circuit 200 is fed with a control signal Sa from an external circuit (not shown) and outputs a control signal Pout for the upper-stage element and a control signal Nout for the lower-stage element of a three-phase inverter circuit. The dead-time generating circuit 200 includes a current mirror circuit 201, a delay time setting circuit 202, and an external resistor R10 connected to a terminal Tm10. The external resistor R10 sets a current that is outputted by the current mirror circuit 201. The delay time setting circuit 202 includes capacitors C11 and C12; discharge transistors T21 and T22 connected in parallel to the capacitors C11 and C12, respectively; buffers L12 and L13 configured to compare voltages V11 and V12 of the capacitors C11 and C12 with a threshold voltage so as to output on- or off-control signals Pout and Nout; and an inverter L11 for inverting the control signal Sa.

When the control signal Sa rises, the discharge transistor T21 turns on, so that the capacitor C11 is discharged. At the same time, the discharge transistor T22 turns off, so that the capacitor C12 is charged by the current outputted by the current mirror circuit 201. When the capacitor C11 is discharged and the voltage of the capacitor C11 drops below the threshold voltage of the buffer L12, the control signal Pout becomes an off-signal. On the other hand, when the capacitor C12 is charged and the voltage of the capacitor C12 exceeds the threshold voltage of the buffer L13, the control signal Nout becomes an on-signal. When the control signal Sa falls, the dead-time generating circuit 200 operates similarly as described above, with the operations of the discharge transistor T21 and the capacitor C11 and the operations of the discharge transistor T22 and the capacitor C12 switched. Thus, in the dead-time generating circuit 200, two dead times are generated, starting from the rise and fall timings of the control signal Sa, based on the time in which the capacitors C11 and C12 are charged. Because the magnitude of the current outputted by the current mirror circuit 201 can be set by the external resistor R10, the length of the dead time can be varied by changing the external resistor R10.

In the dead-time generating circuit 200 according to Patent Document 2, even if the capacitors C11 and C12 and the buffers L12 and L13 are designed such that the dead times starting from the rise and fall timings of the control signal Sa can have the same length, the threshold voltages for switching the on- and off-status of the control outputs Pout and Nout may vary due to various reasons. For example, variations may be introduced in the elements during a semiconductor manufacturing process. Also, the threshold voltages may be varied due to the fact that the buffer L12 is an inverter and has a different structure from the structure of the buffer L13. As a result, the two dead times may have different lengths.

FIG. 3 is a timing chart illustrating an operation of the dead-time generating circuit 200 illustrated in FIG. 2 when the threshold voltages are different. When the buffer L12 and the buffer L13 both have the same threshold voltage Vth1, the length of the dead time starting at the rise and fall timings of the control signal Sa is the same time t1. However, when the buffer L12 has a threshold voltage Vth2 lower than the threshold voltage Vth1, the dead time starting at the fall timing of the control signal Sa has a time t2 that is shorter than the length of the dead time t1 starting at the rise timing of the control signal Sa.

In Patent Document 2, it is also described that the length of the dead time does not vary even if the control signal Sa has a narrow pulse width shorter than the discharge times of the capacitors C11 and C12. In Patent Document 2, the time required for discharging the capacitors C11 and C12 is considered zero. However, discharging the capacitors C11 and C12 actually requires at least several to several dozen ns (nanoseconds), depending on the transistor characteristics of the capacitors C11 and C12, the elements for driving the control signal Sa, and a buffer L11. FIG. 4 is a timing chart illustrating an operation in a case where the dead-time generating circuit 200 illustrated in FIG. 2 is fed with a control signal Sa whose H-level period is shorter than the discharge time of the capacitor C11. In this case, because the period in which the control signal Sa has a H-level is shorter than the time required for discharging the capacitor C11, the control signal Sa assumes a L-level when the capacitor C11 is still being discharged, so that the voltage of the capacitor C11 does not drop below the threshold voltage Vth1. Thus, the control signal Pout is fixed to an on-status while the control signal Nout is fixed to an off-status. FIG. 5 is a timing chart illustrating an operation of the dead-time generating circuit 200 of FIG. 2 when a L-level period of a control signal Sa is shorter than the discharge time of the capacitor C12. In this case, too, because the period in which the control signal Sa has a L-level is shorter than the time required for discharging the capacitor C12, the voltage of the capacitor C12 does not drop below the threshold voltage Vth1. As a result, the control signal Pout is fixed to an off-status, while the control signal Nout is fixed to an on-status.

As described above, in either case, neither the capacitor C11 nor the capacitor C12 are discharged below the threshold voltage Vth1, so that the control signals Pout and Nout do not change. When a three-phase brushless DC motor is controlled, a control signal status needs to be changed upon change in rotation direction or during a brake control while ensuring a dead time. Therefore, when the dead-time generating circuit 200 according to Patent Document 2 is applied for controlling a brushless DC motor, if the control signal Sa has a short pulse such that the dead time for the capacitor C11 or C12 cannot be ensured, it may become impossible to perform rotation direction control or brake control, for example.

Patent Document 1: JP2003-289687A
Patent Document 2: JP2003-051740A

DISCLOSURE OF INVENTION

In one aspect, the present invention provides a dead-time generating circuit that includes a constant current circuit configured to generate a constant current whose magnitude is determined by an external resistor; a current generating circuit configured to generate a capacitor-charge current corresponding to the constant current; a control circuit configured to receive a dead time control signal and a comparator signal, the control circuit being configured to generate a dead time generating signal based on the dead time control signal and the comparator signal, and a charge/discharge signal based on the dead time generating signal, wherein the dead time generating signal is delayed from a rise timing or a fall timing of the dead time control signal by a delay time; and a charge/discharge circuit configured to control charging or discharging of a capacitor using the capacitor-charge current from the current generating circuit in accordance with the charge/discharge signal, wherein the charge/discharge circuit is also configured to compare a voltage of the capacitor with a threshold voltage, and to generate a comparator signal when the voltage of the capacitor exceeds the threshold voltage, and wherein the control circuit generates the charge/discharge signal for a duration starting from a time when the delay time has elapsed from the rise or fall timing of the dead time control signal until the control circuit receives the comparator signal.

In another aspect, the present invention provides a motor control apparatus having a driver circuit for controlling a driving of a DC motor in accordance with a PWM signal. The motor control apparatus includes the dead-time generating circuit. The PWM signal is inputted to the dead time generating circuit as the dead time control signal. The motor control apparatus further includes an output PWM generating circuit configured to generate an output PWM signal for controlling the DC motor by retaining the dead time control signal in accordance with the dead time generating signal or resetting in accordance with the dead time control signal, the PWM signal being outputted to the driver circuit.

BEST MODE OF CARRYING OUT THE INVENTION

First Embodiment

Figure 6:
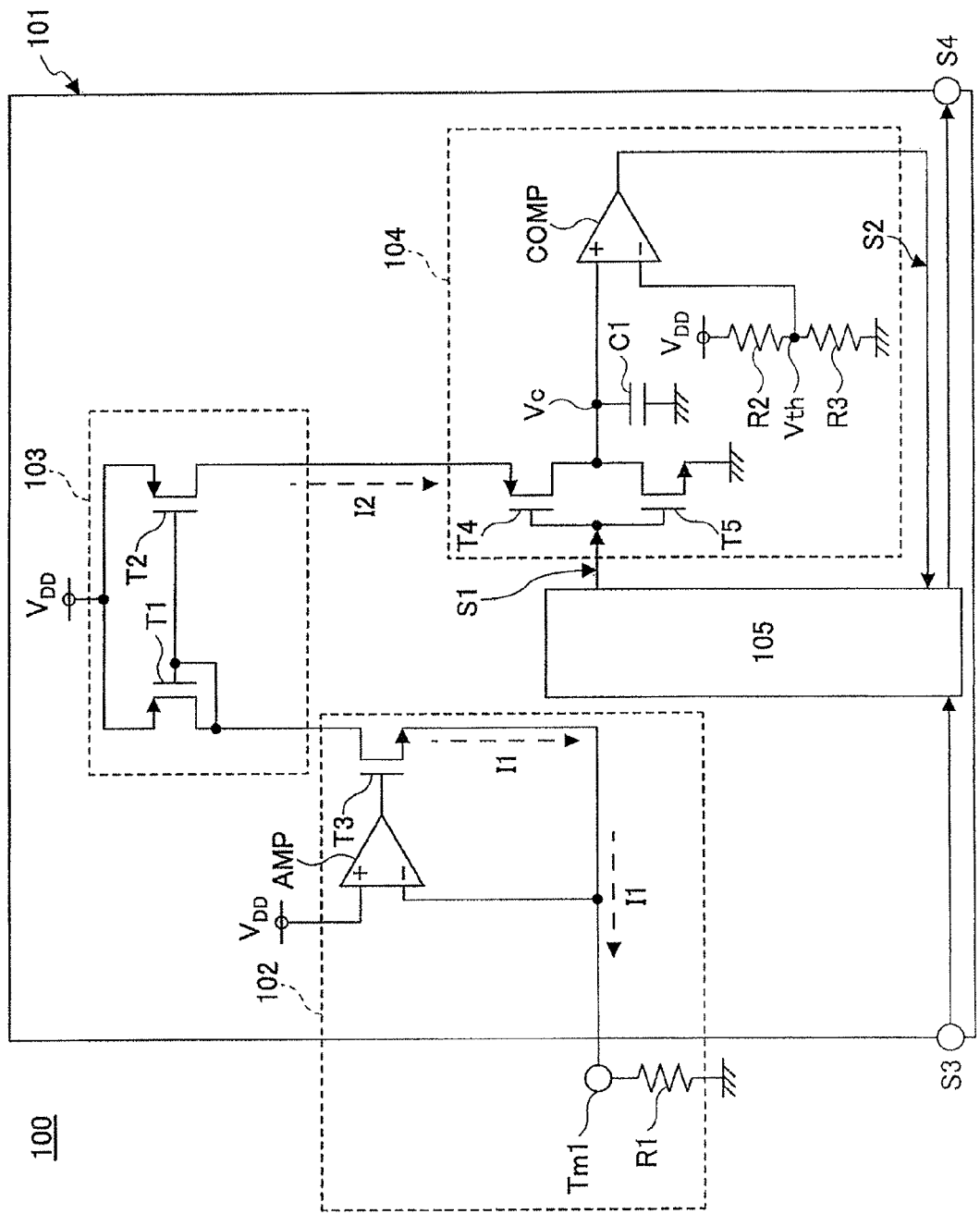
FIG. 6 is a circuit diagram of a dead-time generating circuit 100 according to a first embodiment of the present invention.

FIG. 6 is a circuit diagram of a dead-time generating circuit 100 according to an embodiment of the present invention. The dead-time generating circuit 100 includes an external resistor R1; a terminal Tm1 to which the external resistor R1 is connected; a constant current circuit 102; a current mirror circuit 103; a charge/discharge circuit 104; and a monostable multivibrator control circuit 105. The constant current circuit 102 generates a constant current I1. The current mirror circuit 103 generates a current I2 that is equal to the current I1. The charge/discharge circuit 104 includes a capacitor C1 configured to be charged with the current I2 in order to generate a dead time having the same length as a charge time of the capacitor C1. The magnitude of the current I1 can be varied by varying the value of the resistor R1, thus changing the charge time of the capacitor C1. In this way, the length of the dead time can be set. In the dead-time generating circuit 100, the length of the dead time may be set to vary from several to several dozens ns.

The constant current circuit 102 includes a voltage follower circuit having an operational amplifier AMP. Because a stable voltage $V_{DD}$ is generated within a semiconductor integrated-circuit (IC) 101 based on a power supply voltage, and the stable voltage $V_{DD}$ is inputted to a non-inverting input terminal of the operational amplifier AMP, the voltage of the resistor R1 on the IC 101-side that is connected to an inverting input terminal of the operational amplifier AMP is a constant voltage $V_{DD}$. Thus, a constant current $I1=V_{DD}/R1$ flows via the resistor R1 from the IC 101 to ground. By changing the value of the resistor R1, the value of the current I1 can be varied. The current mirror circuit 103 includes transistors T1 and T2 and is configured to generate the current I2, which is equal to the current I1, and supply the current I2 to the charge/discharge circuit 104.

The charge/discharge circuit 104 includes an inverter including transistors T4 and T5 and the capacitor C1, and a comparator COMP. The inverter is configured to charge or discharge the capacitor C1 in accordance with a charge/discharge signal S1. The inverter is supplied with the current I2 from the current mirror circuit 103. When the charge/discharge signal S1 has a H-level, the P channel transistor T4 turns on, so that the current I2 flows into the capacitor C1, thereby charging the capacitor C1. On the other hand, when the charge/discharge signal S1 has a L-level, the N channel transistor T5 turns on, so that the capacitor C1 is discharged via the N channel transistor T5. The comparator COMP is configured to compare the voltage Vc of the capacitor C1 with a threshold voltage Vth, and output a comparator signal S2 indicating a comparison result to the monostable multivibrator control circuit 105. The comparator signal S2 has a H-level when Vc≥Vth and a L-level when Vc<Vth.

If the threshold voltage Vth varies, the time before the voltage Vc exceeds the threshold voltage Vth also varies, resulting in variation of the length of the dead time. However, in the dead-time generating circuit 100, the threshold voltage Vth may be considered constant for the following reasons: (1) the threshold voltage Vth is not easily affected by the fluctuation of the power supply voltage because the threshold voltage Vth is obtained by dividing the stable voltage $V_{DD}$ using the resistors R2 and R3; and (2) variations in the resistors R2 and R3 used for obtaining the threshold voltage Vth can be minimized by adopting a common centroid structure for the resistors, for example. Thus, in the dead-time generating circuit 100, variations in the length of the dead time due to the variation in the threshold voltage Vth is minimized.

The monostable multivibrator control circuit 105 receives a dead time control signal S3 from an external circuit (not shown) and the comparator signal S2 from the charge/discharge circuit 104, and outputs a charge/discharge signal S1 to the charge/discharge circuit 104 and a dead time generating signal S4. The charge/discharge signal S1, the comparator signal S2, the dead time control signal S3, and the dead time generating signal S4 have a H-level or a L-level. The monostable multivibrator control circuit 105 generates the dead time generating signal S4 by controlling the charging and discharging of the capacitor C1 at the last rise (or fall) timing in a succession of rises or falls of the dead time control signal S3.

Figure 8:
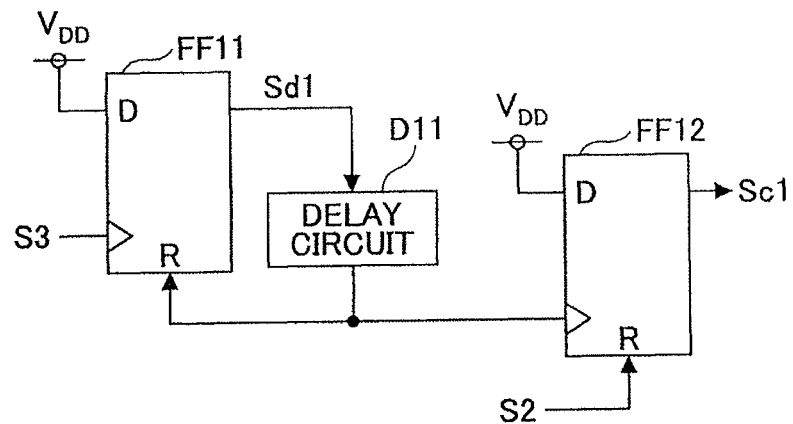
FIG. 8 is a circuit diagram of a first control logic circuit contained in a monostable multivibrator control circuit 105 according to the first embodiment of the present invention.
Figure 9:
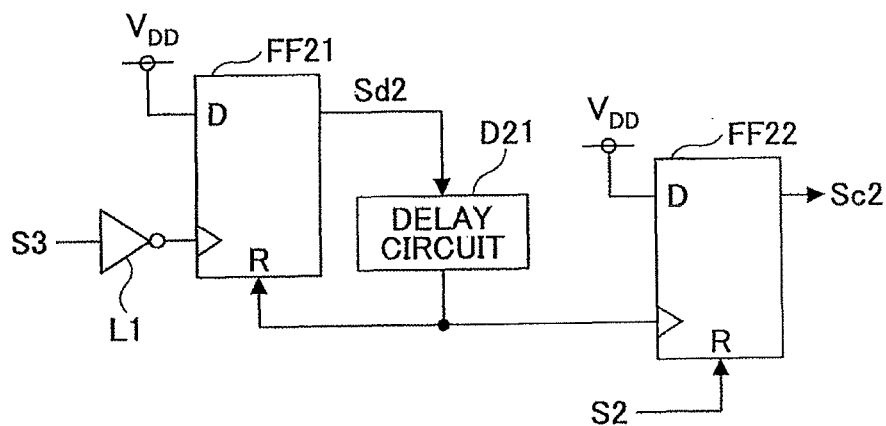
FIG. 9 is a circuit diagram of a second control logic circuit contained in a monostable multivibrator control circuit 105 according to the first embodiment of the present invention.
Figure 10:
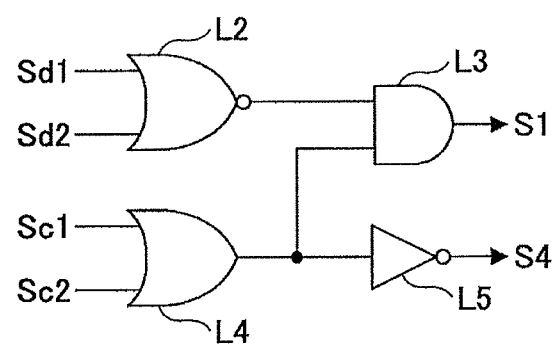
FIG. 10 is a circuit diagram of a third control logic circuit contained in the monostable multivibrator control circuit 105 according to the first embodiment of the present invention.

FIGS. 8, 9, and 10 are circuit diagrams illustrating the monostable multivibrator control circuit 105 in detail, where D is a signal input terminal and R is a reset signal input terminal. FIG. 8 illustrates a control logic circuit that includes D flip-flops FF11 and FF12 and a delay circuit D11. The control logic circuit is configured to receive the dead time control signal S3 and the comparator signal S2, and generate a discharge signal Sd1 and a charge signal Sc1. A control logic circuit illustrated in FIG. 9 includes an inverter L1, D flip-flops FF21 and FF22, and a delay circuit D21. The control logic circuit is configured to receive the dead time control signal S3 and the comparator signal S2, and generate a discharge signal Sd2 and a charge signal Sc2. The discharge signal Sd1 and the charge signal Sc1 from the control logic circuit of FIG. 8 are fed to a control logic circuit illustrated in FIG. 10. The discharge signal Sd2 and the charge signal Sc2 from the control logic circuit of FIG. 9 are also fed to the control logic circuit of FIG. 10. The control logic circuit of FIG. 10 includes a NOR gate L2, an AND gate L3, an OR gate L4, and a NOT gate L5. The control logic circuit of FIG. 10 generates a charge/discharge signal S1 and a dead time generating signal S4 based on the discharge signals Sd1 and Sd2 and the charge signals Sc1 and Sc2. The charge/discharge signal S1 is a logical AND of a signal indicating a NOT of a logical OR of the discharge signal Sd1 and the discharge signal Sd2, and a logical OR of the charge signals Sc1 and Sc2. The dead time generating signal S4 is a signal indicating a NOT of a logical OR of the charge signals Sc1 and Sc2.

With reference to FIG. 6 and FIGS. 8 through 10, an operation of the monostable multivibrator control circuit 105 is described. Because the dead time control signal S3 is inputted as a clock for the D flip-flops FF11 and FF21, the circuit of FIG. 8 is driven when the dead time control signal S3 rises, while the circuit of FIG. 9 is driven when the dead time control signal S3 falls. In an initial state, the dead time control signal S3, the discharge signal Sd1, the charge signal Sc1, the discharge signal Sd2, and the charge signal Sc2 all have a L-level, so that the charge/discharge signal S1 has a L-level and the dead time generating signal S4 has a H-level. When the dead time control signal S3 rises, the D flip-flop FF11 is driven, so that the discharge signal Sd1 has a H-level. As a result, the charge/discharge signal S1 has a L-level, so that the capacitor C1 is discharged. The discharge signal Sd1 is inputted to the delay circuit D11. After a duration of time, a H-level is inputted to the clock of the D flip-flop FF12 and to the reset of the D flip-flop FF11. Consequently, the D flip-flop FF11 is reset and the discharge signal Sd1 has a L-level, while at the same time the D flip-flop FF12 is driven and the charge signal Sc1 has a H-level. As a result, the charge/discharge signal S1 has a H-level, and therefore the charging of the capacitor C1 starts. At this time, the dead time generating signal S4 has a L-level. When the capacitor voltage Vc exceeds the threshold voltage Vth as the capacitor C1 is charged, the comparator COMP outputs a H-level comparator signal S2. As a result, the D flip-flop FF12 is reset, so that the charge signal Sc1 has a L-level and the charge/discharge signal S1 also has a L-level. At this time, the dead time generating signal S4 has a H-level. When the dead time control signal falls, the circuit of FIG. 9 operates in the same way as the circuit of FIG. 8.

The delay circuits D11 and D21 of FIGS. 8 and 9, respectively, are configured to cause the charge signals Sc1 and Sc2 to have a H-level at the end of a delay time t3 after the discharge signals Sd1 and Sd2 have assumed a H-level. Thus, the capacitor C1 can be discharged for a period equal to the delay time t3 before the capacitor C1 is charged. Because the delay time t3 is included in the length of the dead time, the delay time t3 may introduce an error in the dead time in the case where the length of the dead time is set to correspond to the charge time of the capacitor C1. Thus, the delay time t3 should be minimized. However, by setting the delay time t3 longer than the time it takes for the capacitor C1 to be discharged to 0 V, it can be ensured that the capacitor C1 is charged from 0 V. In this way, the length of the dead time can be reliably made longer than the charge time of the capacitor C1. Further, by decreasing the capacitance of the capacitor C1, the discharge time of the capacitor C1 can be made shorter, and therefore the delay time t3 can be made shorter and also the circuit area can be reduced. Based on the above description, the length Td of the dead time can be expressed by the following expression (1):

$$Td = (C \times Vth)/I2 + t3 \quad (1)$$

where C is the capacitance of the capacitor C1. The expression (1) indicates that the length Td of the dead time is a sum of the time it takes for the capacitor C1 to be charged to the threshold voltage Vth by the current I2, and the delay time t3.

Figure 1:
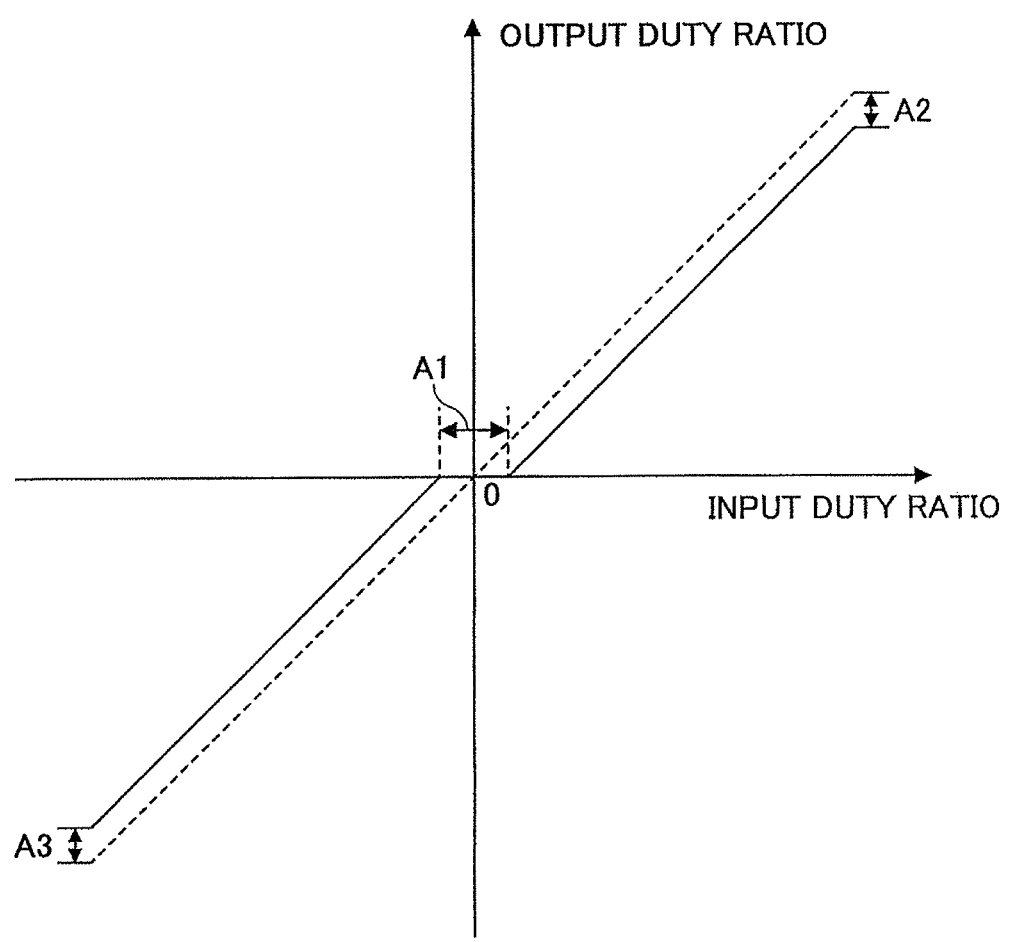
FIG. 1 is a graph illustrating the relationship between an input duty ratio of a PWM signal inputted to a system and an output duty ratio of an output signal outputted to a motor in accordance with the related art.
Figure 2:
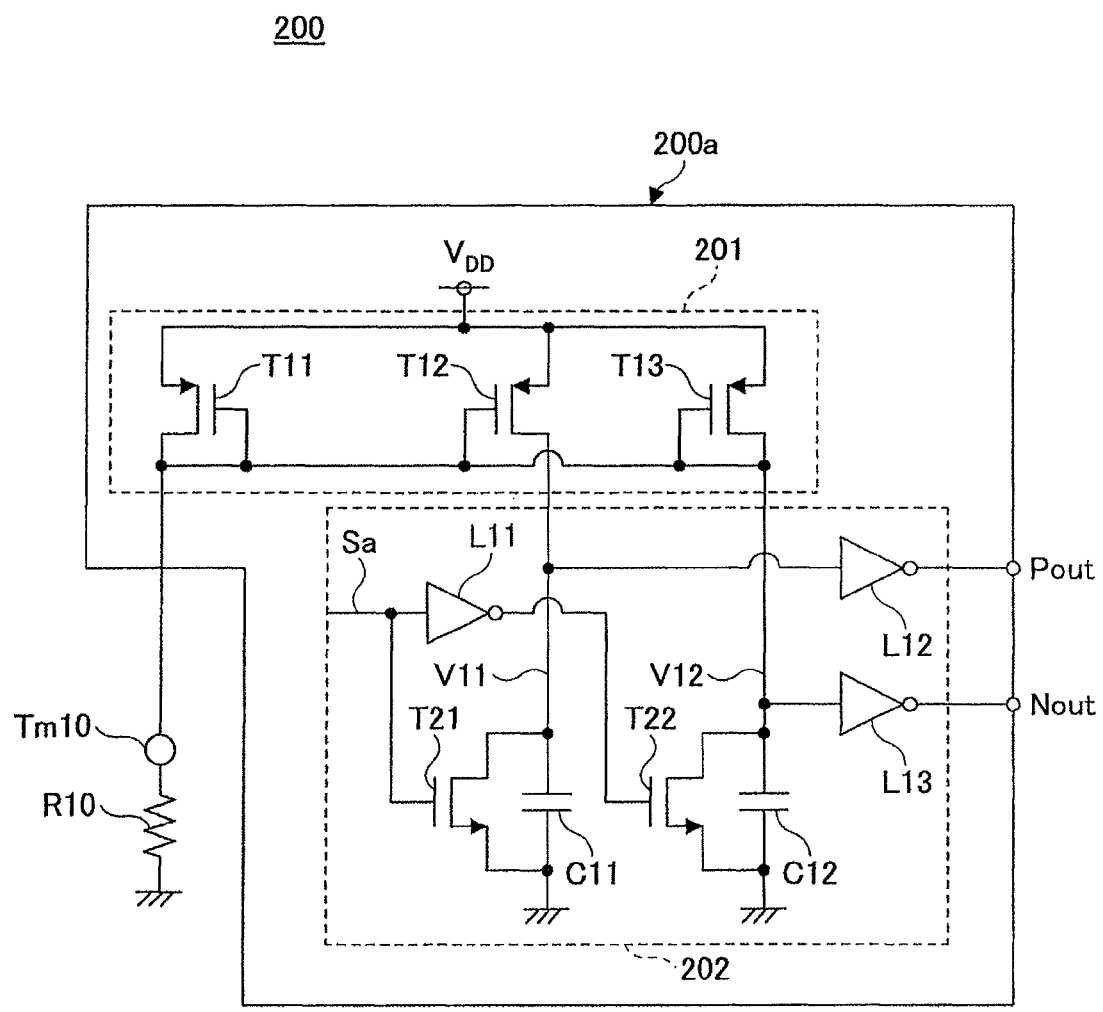
FIG. 2 is a circuit diagram of a dead-time generating circuit 200 according to the related art.
Figure 3:
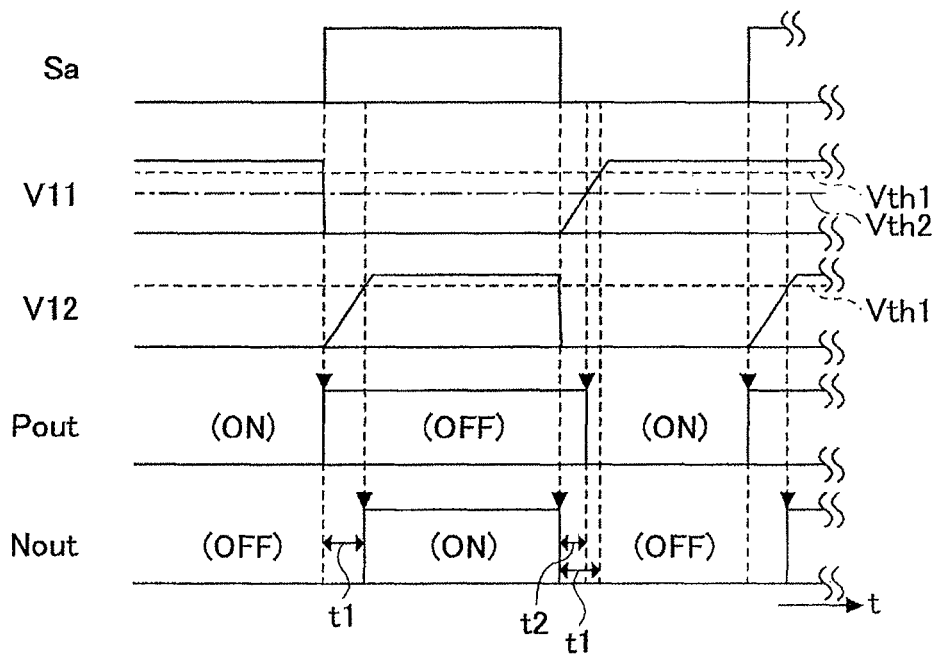
FIG. 3 is a timing chart illustrating an operation of the dead-time generating circuit 200 of FIG. 2 based on different threshold voltages.
Figure 4:
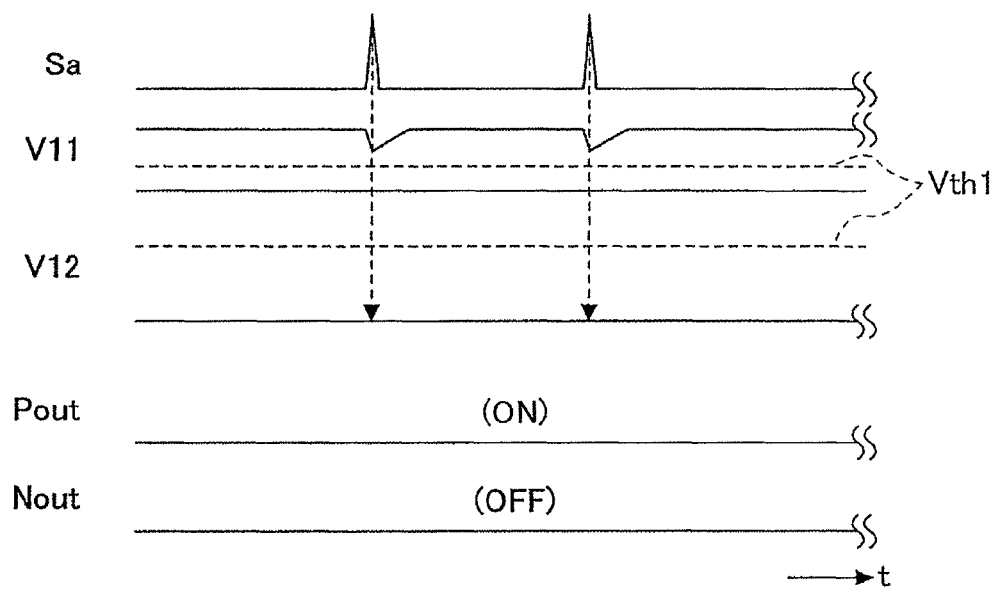
FIG. 4 is a timing chart of an operation of the dead-time generating circuit 200 in a case where a H-level period of a control signal Sa is shorter than a discharge time of a capacitor C11.
Figure 5:
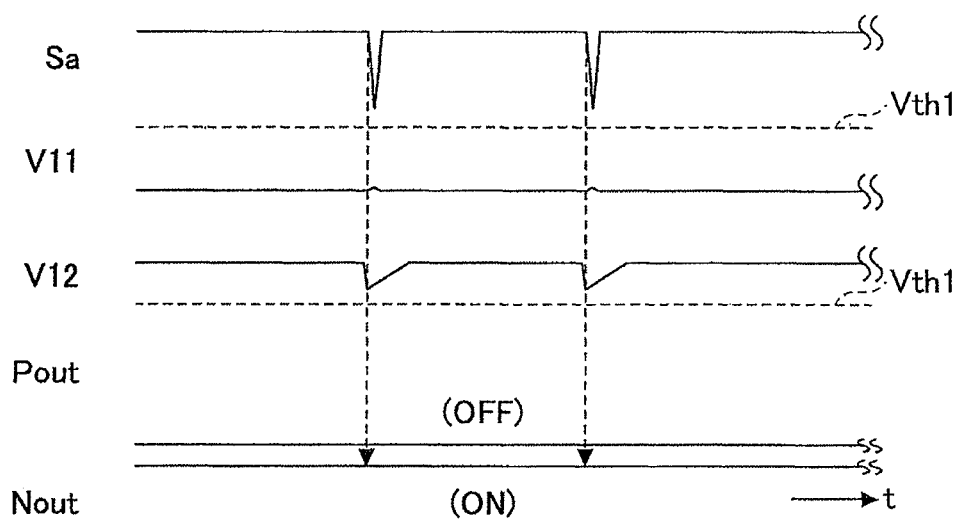
FIG. 5 is a timing chart of an operation of the dead-time generating circuit 200 in a case where a L-level period of the control signal Sa is shorter than a discharge time of a capacitor C12.
Figure 11:
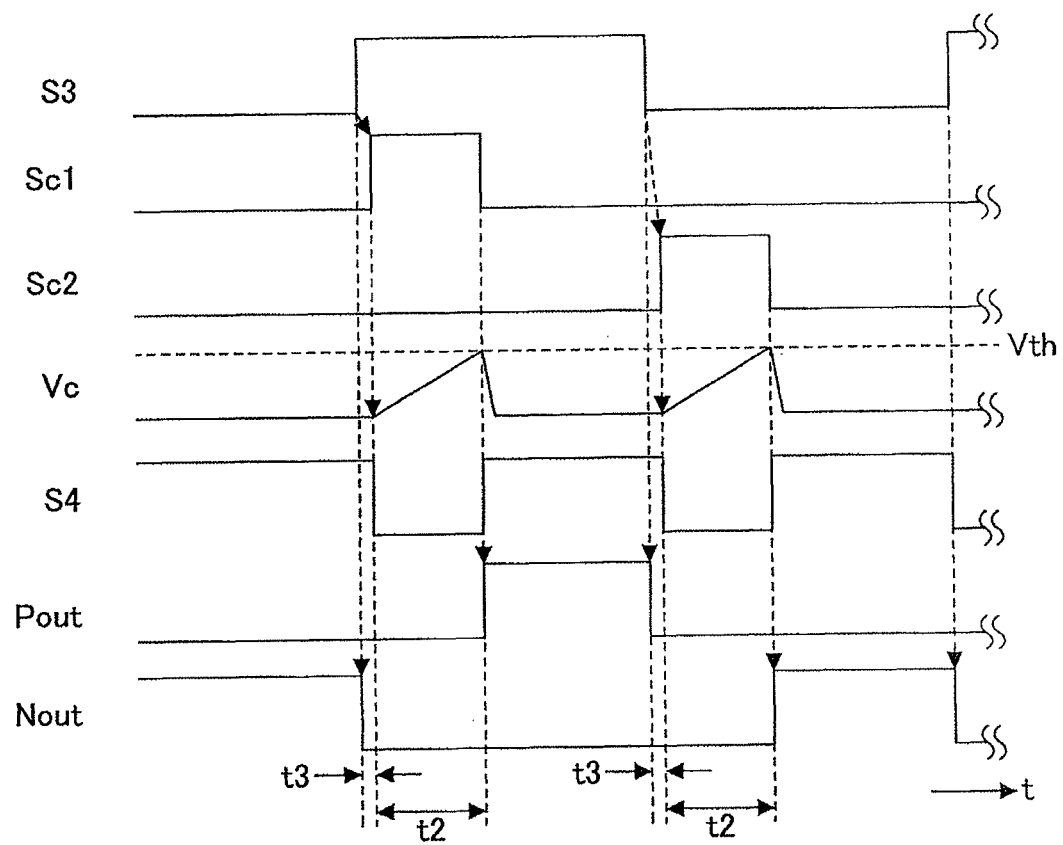
FIG. 11 is a timing chart of an operation of the dead-time generating circuit 100 according to the first embodiment of the present invention.

FIG. 11 is a timing chart of an operation of the dead-time generating circuit 100 according to the present embodiment. The dead time control signal S3 rises and, after the delay time t3 (which may be 10 ns, for example), the charge signal Sc1 rises. During the delay time t3, the charge/discharge signal S1 is at a L-level, and the capacitor C1 is in a discharged status. After the delay time t3, the charge/discharge signal S1 assumes a H-level and then the capacitor C1 is charged, while the dead time generating signal S4 falls. After the time t2 (such as 40 ns), the capacitor voltage Vc reaches the threshold voltage Vth when the charge/discharge signal S1 falls. At the same time, the dead time generating signal S4 rises. The period in which the dead time generating signal S4 is at a L-level is the dead time. The dead-time generating circuit 100 operates similarly when the dead time control signal S3 falls. As mentioned above, at the rise and fall timings of the dead time control signal S3, the period in which the dead time generating signal S4 is at the L-level, i.e., the dead time, is generated. In the dead-time generating circuit 100, because the dead time is based on the charge time of the single capacitor C1, the dead times having the same length can be generated at the rise and fall timings of the dead time control signal S3. Although the output signal of the dead-time generating circuit 100 is the dead time generating signal S4, control signals Pout and Nout are illustrated in FIG. 11. This is for the purpose of comparison with the control signals Pout and Nout of the related art illustrated in FIGS. 3 through 5.

Figure 12:
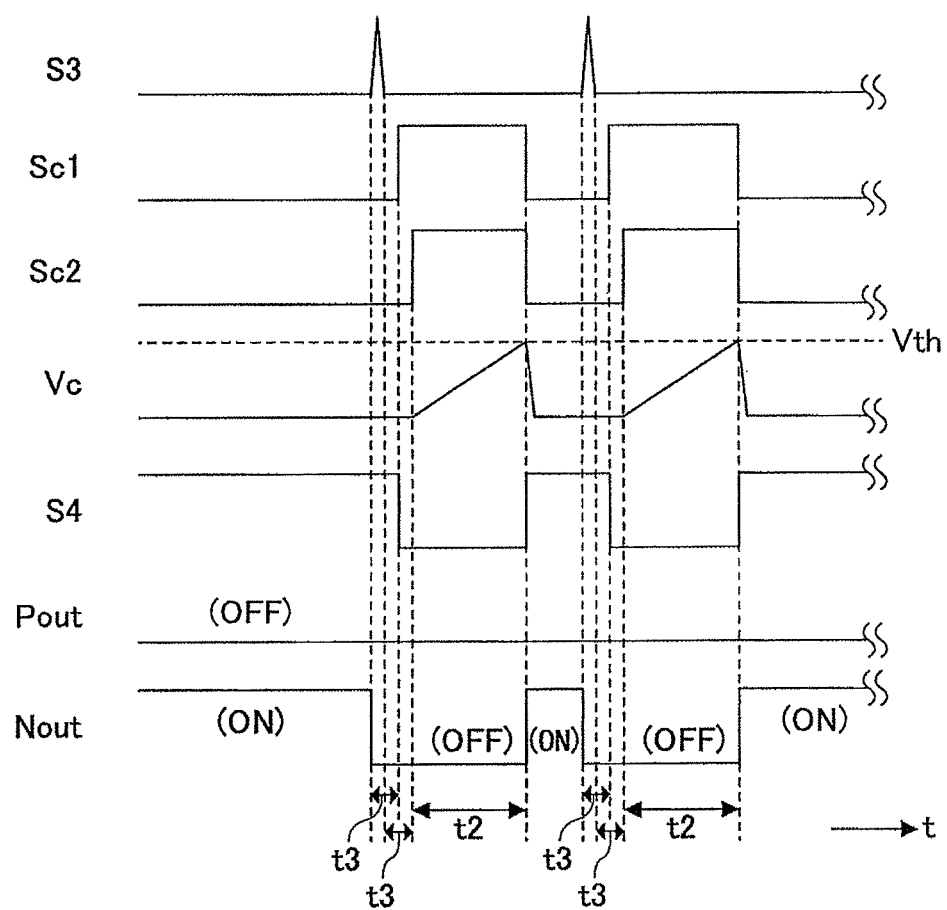
FIG. 12 is a timing chart of an operation of the dead-time generating circuit 100 when a H-level period of a dead time control signal S3 is shorter than a discharge time of the capacitor C1.

FIG. 12 is a timing chart of an operation of the dead-time generating circuit 100 in a case where a H-level period of the dead time control signal S3 is shorter than the discharge time of the capacitor C1. In this case, the dead time control signal S3 rises and then falls while the capacitor C1 is being discharged during the delay time t3. The capacitor C1 is discharged again at the fall timing of the control signal S3, and after the delay time t3, the capacitor C1 begins to be charged. After the time t2 when the voltage Vc of the capacitor C1 exceeds the threshold voltage Vth, discharge of the capacitor C1 begins. The dead time generating signal S4 assumes a L-level when the delay time t3 elapses following the rise of the dead time control signal S3. The dead time generating signal S4 assumes a H-level upon completion of charging of the capacitor C1. Thus, even when the H-level period of the dead time control signal S3 is shorter than the discharge time of the capacitor C1, the capacitor C1 is charged after the capacitor C1 is completely discharged, so that a set dead time can be reliably obtained.

Figure 13:
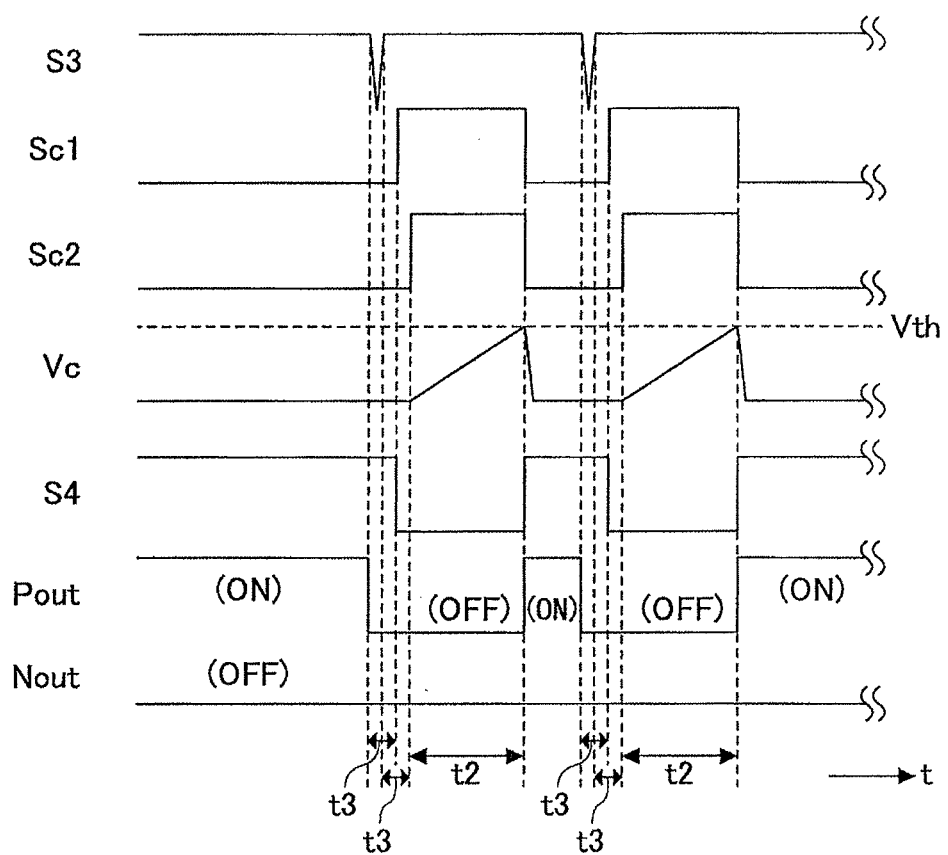
FIG. 13 is a timing chart of an operation of the dead-time generating circuit 100 when a L-level period of the dead time control signal S3 is shorter than the discharge time of the capacitor C1.

FIG. 13 is a timing chart of an operation of the dead-time generating circuit 100 in a case where a L-level period of the dead time control signal S3 is shorter than the discharge time of the capacitor C1. In this case, too, the operation is similar to the timing chart of FIG. 12. Although the output signal of the dead-time generating circuit 100 is the dead time generating signal S4, control signals Pout and Nout are illustrated in FIGS. 12 and 13 for the purpose of comparison with the control signals Pout and Nout of the aforementioned related art.

As described above, at the rise and fall timings of the dead time control signal S3, the capacitor C1 is discharged during the delay time t3 produced by the delay circuits D11 and D12 illustrated in FIGS. 8 and 9, and then charging of the capacitor C1 is started after the capacitor voltage Vc is zero. Thus, the capacitor can be reliably charged even when the pulse width of the dead time control signal S3 is shorter than the time it takes for the capacitor C1 to be discharged, so that a set dead time can be ensured.

Figure 14:
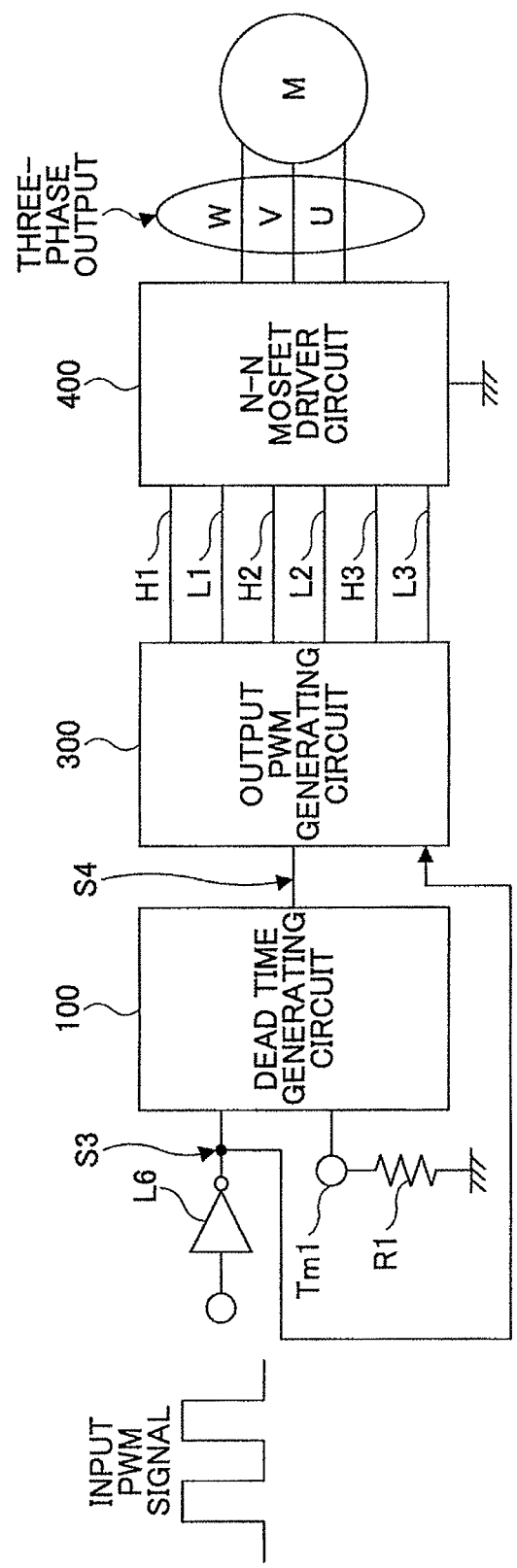
FIG. 14 is a block diagram of a motor control system including the dead-time generating circuit 100 illustrated in FIG. 6.

FIG. 14 is a block diagram of a motor control system incorporating the dead-time generating circuit 100 of FIG. 6. In addition to the dead-time generating circuit 100, the motor control system includes an inverter L6 for inverting an input PWM signal; an external resistor R1; a terminal Tm1 to which the external resistor R1 is connected; an output PWM generating circuit 300; an N channel-N channel MOSFET driver circuit 400; and a motor M. As described above, the dead-time generating circuit 100 receives the dead time control signal S3 from an external circuit (not shown), generates the dead time generating signal S4, and then outputs the dead time generating signal S4 to the output PWM generating circuit 300.

Figure 17:
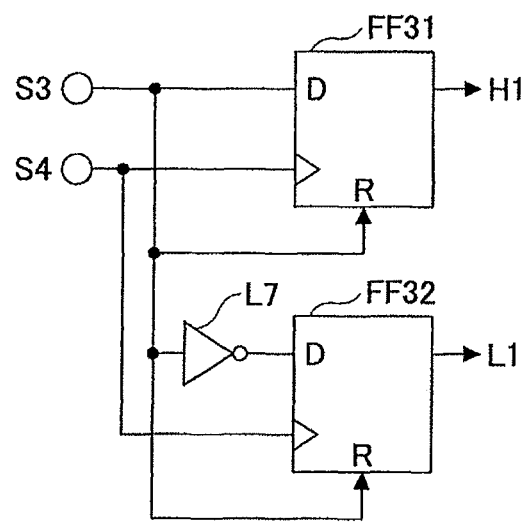
FIG. 17 is a circuit diagram of an output PWM generating circuit 300 that may be used in the motor control system of FIG. 14.

FIG. 17 is a circuit diagram of the output PWM generating circuit 300 that may be utilized in the motor control system of FIG. 14. The output PWM generating circuit 300 includes D flip-flops FF31 and FF32 and an inverter L7. The output PWM generating circuit 300 receives the dead time control signal S3 and the dead time generating signal S4, generates control signals H1 through H3 and L1 through L3 for the switching elements, and then outputs these control signals to the N channel-N channel MOSFET driver circuit 400. While FIG. 17 illustrates only the control signals H1 and L1, the output PWM generating circuit 300 includes two similar circuits configured to output the control signals H2, L2, H3, and L3.

Figure 15:
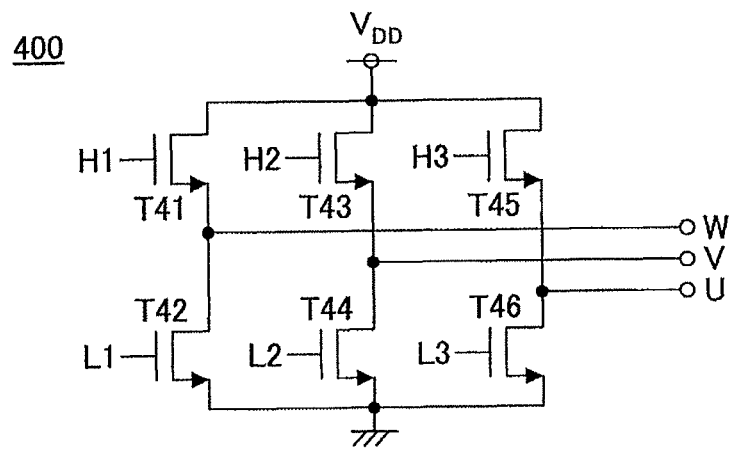
FIG. 15 is a circuit diagram of a N channel-N channel MOSFET driver circuit 400 that may be used in the motor control system of FIG. 14.

FIG. 15 is a circuit diagram of the N channel-N channel MOSFET driver circuit 400 that may be utilized in the motor control system of FIG. 14. The N channel-N channel MOSFET driver circuit 400, which is a three-phase inverter circuit configured to control the motor M, includes N channel transistors T41 through T46. The N channel transistors T41, T43, and T45 provide the upper-stage elements for the different phases, while the N channel transistors T42, T44, and T46 provide the lower-stage elements for the phases. The N channel-N channel MOSFET driver circuit 400 receives the control signals H1 through H3 for the upper-stage elements of the respective phases, and the control signals L1 through L3 for the lower-stage elements, and then outputs drive signals W, V, and U for the respective phases to the motor M.

Figure 16:
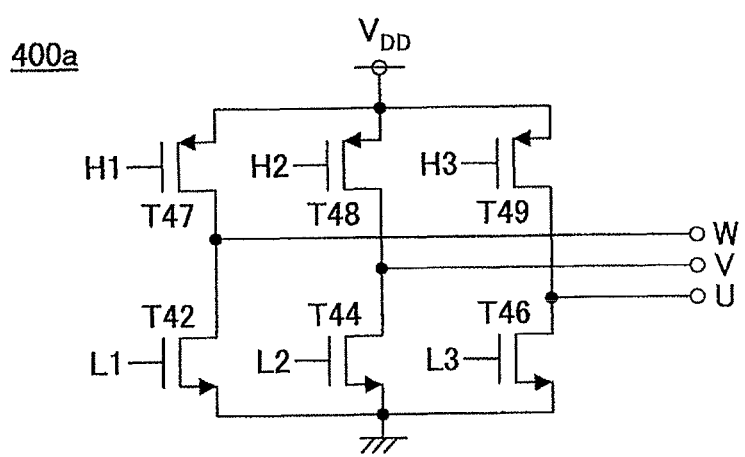
FIG. 16 is a circuit diagram of a P channel-N channel MOSFET driver circuit 400a that may be used in the motor control system of FIG. 14.

While in the example of FIG. 15 the upper-stage elements and the lower-stage elements both comprise N channel transistors, the present invention is not limited to such an example. Alternatively, a P channel-N channel MOSFET driver circuit 400a comprising P channel transistors and N channel transistors, as illustrated in FIG. 16, may be adopted. In this case, the motor M can be controlled by modifying the output PWM generating circuit 300 without modifying the dead-time generating circuit 100.

As described above, in accordance with the present embodiment, the dead time based on the charge time of the single capacitor C1 is generated at the rise and fall timings of the dead time control signal S3. As a result, the dead times generated at the rise and fall timings of the dead time control signal S3 have the same length. Further, even when the dead time control signal S3 has a pulse shorter than the discharge time of the capacitor, the capacitor C1 is reliably discharged before it is charged. Thus, a dead time equal to or longer than a set length can be ensured. Because the dead time is ensured, the switching elements are prevented from being damaged by an instantaneous inversion of the control signal for an inverting control of the motor or a brake control. Furthermore, the three-phase inverter circuit for controlling the motor M may comprise either N channel transistors or P and N channel transistors by modifying the output PWM generating circuit 300 without modifying the dead-time generating circuit 100. This feature enables the dead-time generating circuit 100 according to the present embodiment to be applied to any application where a signal having a dead time is inputted to a MOSFET driver.

Second Embodiment

Figure 7:
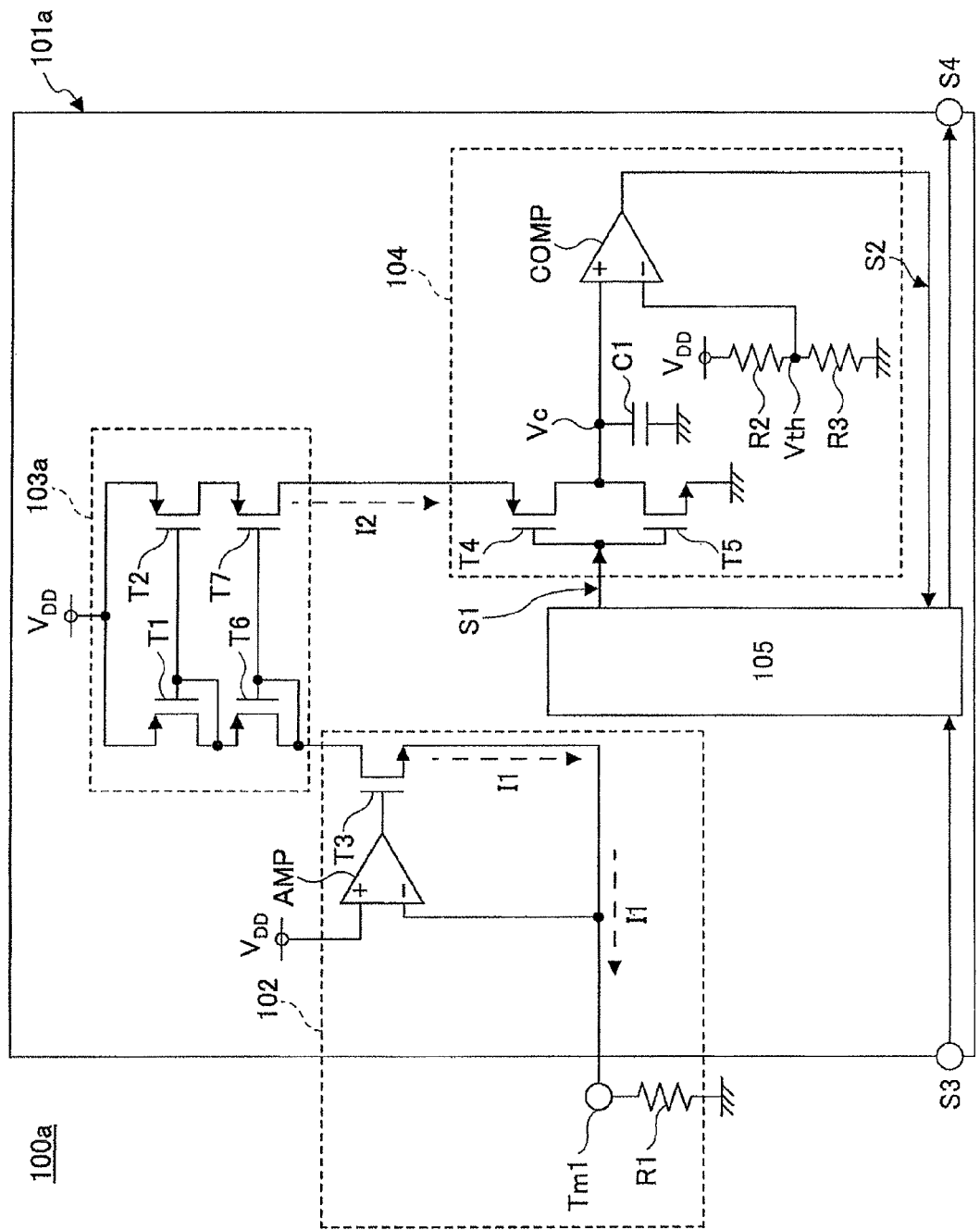
FIG. 7 is a circuit diagram of a dead-time generating circuit 100a according to a second embodiment of the present invention.

FIG. 7 is a circuit diagram of a dead-time generating circuit 100a according to a Second Embodiment of the present invention. The dead-time generating circuit 100a differs from the dead-time generating circuit 100 of FIG. 6 in that a current mirror circuit 103a includes transistors T6 and T7 in a cascade connection. Thus, the current mirror circuit 103a is more robust to the fluctuation in the power supply voltage $V_{DD}$ than the current mirror circuit 103, so that the accuracy of the current I2 can be improved.

As described above, in accordance with the Second Embodiment, the accuracy of the current I2 can be improved, enabling the dead-time generating circuit 100a to generate the dead time more accurately than the dead-time generating circuit 100 according to the First Embodiment.

Thus, in accordance with the embodiments of the present invention, the dead-time generating circuit is configured to generate the dead times at the rise and fall timings of a control signal based on a charge time of one and the same capacitor that is charged and then discharged. Because the dead time is based on the charge time of the same capacitor, the dead times generated at the rise and fall timings of the control signal have the same length. Further, even when the control signal has a pulse shorter than the discharge time of the capacitor, the capacitor can be completely discharged using a delay circuit, thereby enabling the generation of a dead time having a set length. Furthermore, by modifying a control signal outputted to a three-phase inverter circuit in synchronism with the generated dead time, a required dead time can be ensured at the time of a change in rotation direction or during a brake process. In this way, damage to the switching elements included in the three-phase inverter circuit can be prevented.

Although this invention has been described in detail with reference to certain embodiments, variations and modifications exist within the scope and spirit of the invention as described and defined in the following claims.

The present application is based on Japanese Priority Application No. 2009-210673 filed Sep. 11, 2009, the entire contents of which are hereby incorporated by reference.

The invention claimed is:

1. A dead-time generating circuit comprising:
    a constant current circuit configured to generate a constant current whose magnitude is determined by an external resistor;
    a current generating circuit configured to generate a capacitor-charge current corresponding to the constant current;
    a control circuit configured to receive a dead time control signal and a comparator signal, the control circuit being configured to generate a dead time generating signal based on the dead time control signal and the comparator signal, and a charge/discharge signal based on the dead time generating signal, wherein the dead time generating signal is delayed from a rise timing or a fall timing of the dead time control signal by a delay time; and
    a charge/discharge circuit configured to control charging or discharging of a capacitor using the capacitor-charge current from the current generating circuit in accordance with the charge/discharge signal,
    wherein the charge/discharge circuit is also configured to (1) compare a voltage of the capacitor with a threshold voltage, (2) generate the comparator signal when the voltage of the capacitor exceeds the threshold voltage, and (3) output the comparator signal to the control circuit, and
    wherein the control circuit generates the charge/discharge signal for a duration starting from a time when the delay time has elapsed from the rise or fall timing of the dead time control signal until the control circuit receives the comparator signal, and wherein the control circuit stops generating the charge/discharge signal in response to receipt of the comparator signal by the control circuit.

2. A motor control apparatus having a driver circuit for controlling a driving of a brushless DC motor in accordance with a PWM signal, the motor control apparatus comprising the dead-time generating circuit according to claim 1, wherein the PWM signal is inputted to the dead time generating circuit as the dead time control signal, wherein the motor control apparatus further comprises: an output PWM generating circuit configured to generate an output PWM signal for controlling the brushless DC motor by retaining the dead time control signal in accordance with the dead time generating signal or resetting in accordance with the dead time control signal, the PWM signal being outputted to the driver circuit.

3. A dead-time generating circuit comprising:

a constant current circuit configured to generate a constant current whose magnitude is determined by an external resistor;

a current generating circuit configured to generate a capacitor-charge current corresponding to the constant current;

a control circuit configured to receive a dead time control signal and a comparator signal, the control circuit being configured to generate a dead time generating signal based on the dead time control signal and the comparator signal, and a charge/discharge signal based on the dead time generating signal, wherein the dead time generating signal is delayed from a rise timing or a fall timing of the dead time control signal by a delay time; and a charge/discharge circuit configured to control charging or discharging of a capacitor using the capacitor-charge current from the current generating circuit in accordance with the charge/discharge signal, wherein the charge/discharge circuit is also configured to compare a voltage of the capacitor with a threshold voltage, and to generate the comparator signal when the voltage of the capacitor exceeds the threshold voltage, and wherein the control circuit generates the charge/discharge signal for a duration starting from a time when the delay time has elapsed from the rise or fall timing of the dead time control signal until the control circuit receives the comparator signal, wherein the control circuit includes a first latch circuit having a first clock terminal and a first reset terminal and configured to retain the dead time control signal in accordance with a signal inputted to the first clock terminal, and to reset in accordance with a signal inputted to the first reset terminal; a delay circuit configured to delay a signal outputted from the first latch circuit by the delay time; a second latch circuit having a second clock terminal and a second reset terminal and configured to retain the signal outputted from the delay circuit in accordance with a signal inputted to the second clock terminal and to reset in accordance with a signal inputted to the second reset terminal; wherein the dead time control signal is inputted to the first clock terminal, and a signal outputted by the delay circuit is inputted to the first reset terminal, wherein the signal outputted by the delay circuit is inputted to the second clock terminal and the comparator signal is inputted to the second reset terminal, and wherein the dead time generating signal is outputted by the second latch circuit.

4. The dead-time generating circuit according to claim 3, wherein the control circuit includes a gate circuit configured to stop the output of the charge/discharge signal in the absence of the signal outputted from the first latch circuit.

* * * * *